United States Patent
Scheiper et al.

(10) Patent No.: US 8,872,285 B2
(45) Date of Patent: Oct. 28, 2014

(54) METAL GATE STRUCTURE FOR SEMICONDUCTOR DEVICES

(71) Applicant: GLOBALFOUNDRIES Inc., Grand Cayman (KY)

(72) Inventors: Thilo Scheiper, Dresden (DE); Carsten Grass, Dresden (DE); Richard Carter, Dresden (DE); Martin Trentzsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/781,907

(22) Filed: Mar. 1, 2013

(65) Prior Publication Data

US 2014/0246735 A1    Sep. 4, 2014

(51) Int. Cl.
*H01L 21/02* (2006.01)
*H01L 29/78* (2006.01)

(52) U.S. Cl.
CPC ..................................... *H01L 29/78* (2013.01)
USPC ......................................... 257/406; 257/407

(58) Field of Classification Search
USPC .................................................. 257/406, 407
See application file for complete search history.

(56) References Cited

U.S. PATENT DOCUMENTS

| | | | |
|---|---|---|---|
| 5,312,768 A | 5/1994 | Gonzalez | |
| 6,261,934 B1 | 7/2001 | Kraft et al. | |
| 6,373,135 B1 | 4/2002 | Weber | |
| 6,635,564 B1 | 10/2003 | Weber et al. | |
| 6,639,319 B2 | 10/2003 | Iyer et al. | |
| 6,894,353 B2 | 5/2005 | Samavedam et al. | |
| 7,829,949 B2 * | 11/2010 | Tseng et al. | 257/351 |
| 8,030,716 B2 * | 10/2011 | Park et al. | 257/407 |
| 8,304,841 B2 * | 11/2012 | Xu et al. | 257/384 |
| 8,343,837 B2 | 1/2013 | Carter et al. | |
| 2011/0309455 A1 | 12/2011 | Ando et al. | |
| 2012/0119204 A1 | 5/2012 | Wong et al. | |
| 2012/0299123 A1 | 11/2012 | Ando et al. | |
| 2012/0319205 A1 | 12/2012 | Hempel et al. | |

* cited by examiner

*Primary Examiner* — Phat X Cao
(74) *Attorney, Agent, or Firm* — Amerson Law Firm, PLLC

(57) ABSTRACT

Disclosed herein are various embodiments of an improved metal gate structure for semiconductor devices, such as transistors. In one example disclosed herein, a transistor has a gate structure consisting of a gate insulation layer positioned on a semiconducting substrate, a high-k insulation layer positioned on the gate insulation layer, a layer of titanium nitride positioned on the high-k insulation layer, a layer of aluminum positioned on the layer of titanium nitride and a layer of polysilicon positioned on the layer of aluminum.

2 Claims, 7 Drawing Sheets

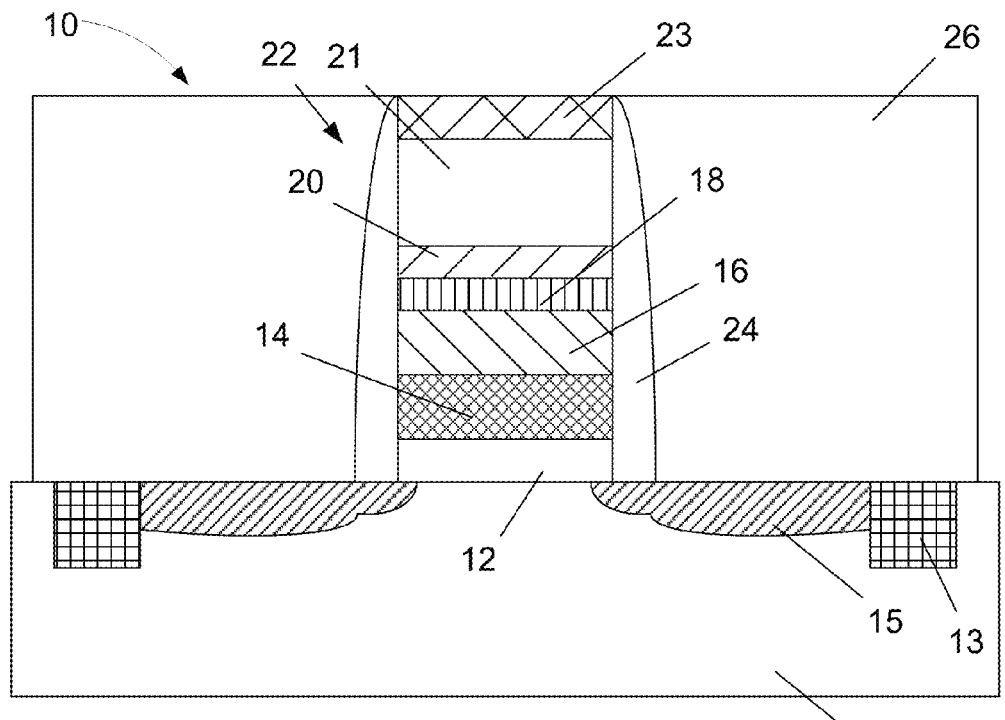
(Prior Art) Figure 1
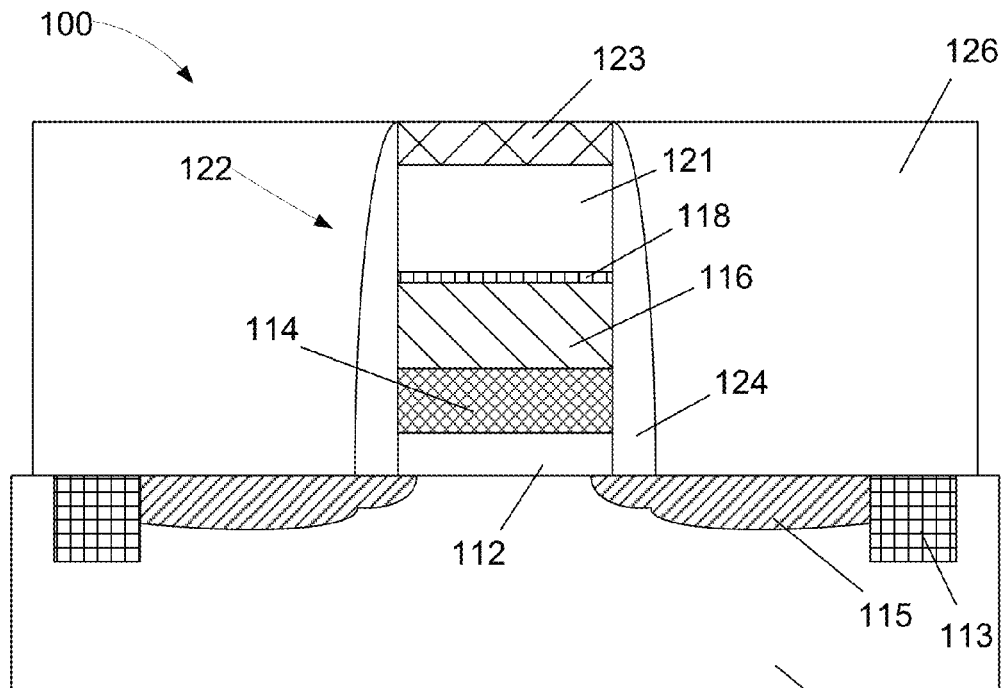
Figure 2

METAL GATE STRUCTURE FOR SEMICONDUCTOR DEVICES

BACKGROUND OF THE INVENTION

1. Field of the Invention

Generally, the present disclosure relates to the manufacture of sophisticated semiconductor devices, and, more specifically, to various embodiments of an improved metal gate structure for semiconductor devices, such as transistors.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NFET and PFET transistors) represent an important type of circuit element that substantially determines performance of the integrated circuits. During the fabrication of complex integrated circuits using, for instance, MOS (metal-oxide-semiconductor) technology, millions of transistors, e.g., NFET transistors and/or PFET transistors, are formed on a substrate including a crystalline semiconductor layer. A field effect transistor, irrespective of whether an NFET transistor or a PFET transistor is considered, typically comprises so-called PN junctions that are formed by an interface of highly doped regions, referred to as drain and source regions, with a slightly doped or non-doped region, such as a channel region, disposed between the highly doped source/drain regions.

In a field effect transistor, the conductivity of the channel region, i.e., the drive current capability of the conductive channel, is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, reducing channel length (or scaling), and associated therewith the reduction of channel resistivity and the increase of gate resistivity, are dominant design efforts used to increase the operating speed of the integrated circuits.

For many early device technology generations, the gate structures of most transistor devices were made of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate electrode structures comprising alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate electrode structures or stacks comprising a so-called high-k dielectric/metal gate (HK/MG) configuration have been shown to provide significantly enhanced operational characteristics over transistors that employed traditional gate structures comprised of the previously described silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in HK/MG gate electrode structures. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

FIG. 1 depicts one illustrative prior art transistor 10 with an HK/MG gate structure 22. As shown in FIG. 1, the process includes the formation of a basic transistor structure 10 above a semiconducting substrate 11 in an active area defined by a shallow trench isolation structure 13. At the point of fabrication depicted in FIG. 1, the gate structure 22 of the device 10 includes a silicon dioxide gate insulation layer 12 having a thickness of about 1 nm, a layer of hafnium oxide 14 having a thickness of about 1.7 nm, a first layer of titanium nitride 16 having a thickness of about 1.5 nm, a layer of aluminum 18 having a thickness of about 0.2 nm, a second layer of titanium nitride 20 having a thickness of about 0.5 nm and a layer of polysilicon 21 having a thickness of about 50-65 nm. Also depicted in FIG. 1 is an illustrative protective gate cap layer 23 (e.g., silicon nitride), illustrative sidewall spacers 24 (e.g., silicon nitride), a layer of insulating material 26 (e.g., silicon dioxide) and source/drain regions 15 formed in the substrate 11.

The various components and structures of the device 10 may be formed using a variety of different materials and by performing a variety of known techniques. For example, the sidewall spacers 24 may be comprised of silicon nitride and the layer of insulating material 26 may be comprised of silicon dioxide. The source/drain regions 15 may be comprised of implanted dopant materials (N-type dopants for NFET devices and P-type dopant for PFET devices) that are implanted into the substrate using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high-performance PFET transistors. In some cases, layers of metal other than the titanium nitride layers may be employed in such devices and other high-k insulation materials may be used in the device 10 instead of the depicted layer of hafnium oxide 14.

The device depicted in FIG. 1 may be formed using traditional gate-first manufacturing techniques. For example, in a CMOS product, after the N and P wells are formed in the substrate, the channel silicon/germanium layer for the PFET devices may be formed, followed by the formation of the gate insulation layer 12. Then, the high-k insulation layer 14, e.g., hafnium oxide, is deposited on the gate insulation layer 12 for both the PFET and NFET devices. Thereafter, work function adjusting metals (not shown), such as lanthanum and aluminum, are deposited for the NFET and PFET devices (with appropriate masking layers in place). A work function anneal process is then performed to drive metal from the work function metals into the high-k insulation layer 14. All work function adjusting metal materials may then be removed and the final metal layer(s) for the device, e.g., layers 16, 18 and 20, may be deposited on both the NFET and PFET devices. Thereafter, the polysilicon layer 21 may then be deposited over the final metal layer(s). The gate cap layer 23, e.g., silicon dioxide, may then be deposited above the layer of polysilicon 21. Thereafter, the various layers of material are patterned into the final gate structure for the device using known etching and photolithography techniques.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of an improved metal gate structure for semiconductor devices, such as transistors. In one example disclosed herein, a transistor has a gate structure consisting of a gate insulation layer positioned on a semiconducting substrate, a high-k insulation layer positioned on the gate insulation layer, a layer of titanium nitride positioned on the high-k insulation layer, a layer of aluminum positioned on the layer of titanium nitride and a layer of polysilicon positioned on the layer of aluminum.

In another example disclosed herein, a transistor has a gate structure consisting of a silicon dioxide gate insulation layer positioned on a semiconducting substrate, a layer of hafnium oxide positioned on the silicon dioxide gate insulation layer, a layer of titanium nitride positioned on the layer of hafnium oxide, a layer of aluminum positioned on the layer of titanium nitride and a layer of polysilicon positioned on the layer of aluminum.

In yet another example disclosed herein, a transistor has a gate structure consisting of a silicon dioxide gate insulation layer having a thickness of about 1 nm positioned on a semiconducting substrate, a layer of hafnium oxide having a thickness of about 1.7 nm positioned on the silicon dioxide gate insulation layer, a layer of titanium nitride having a thickness of about 2 nm positioned on the layer of hafnium oxide, a layer of aluminum having a thickness of about 0.2 nm positioned on the layer of titanium nitride and a layer of polysilicon positioned on the layer of aluminum.

BRIEF DESCRIPTION OF THE DRAWINGS

The disclosure may be understood by reference to the following description taken in conjunction with the accompanying drawings, in which like reference numerals identify like elements, and in which:

FIG. 1 depicts an illustrative prior art transistor device with a particular metal gate structure;

FIG. 2 depicts a novel transistor device with a novel metal gate structure; and

Figure 2A:
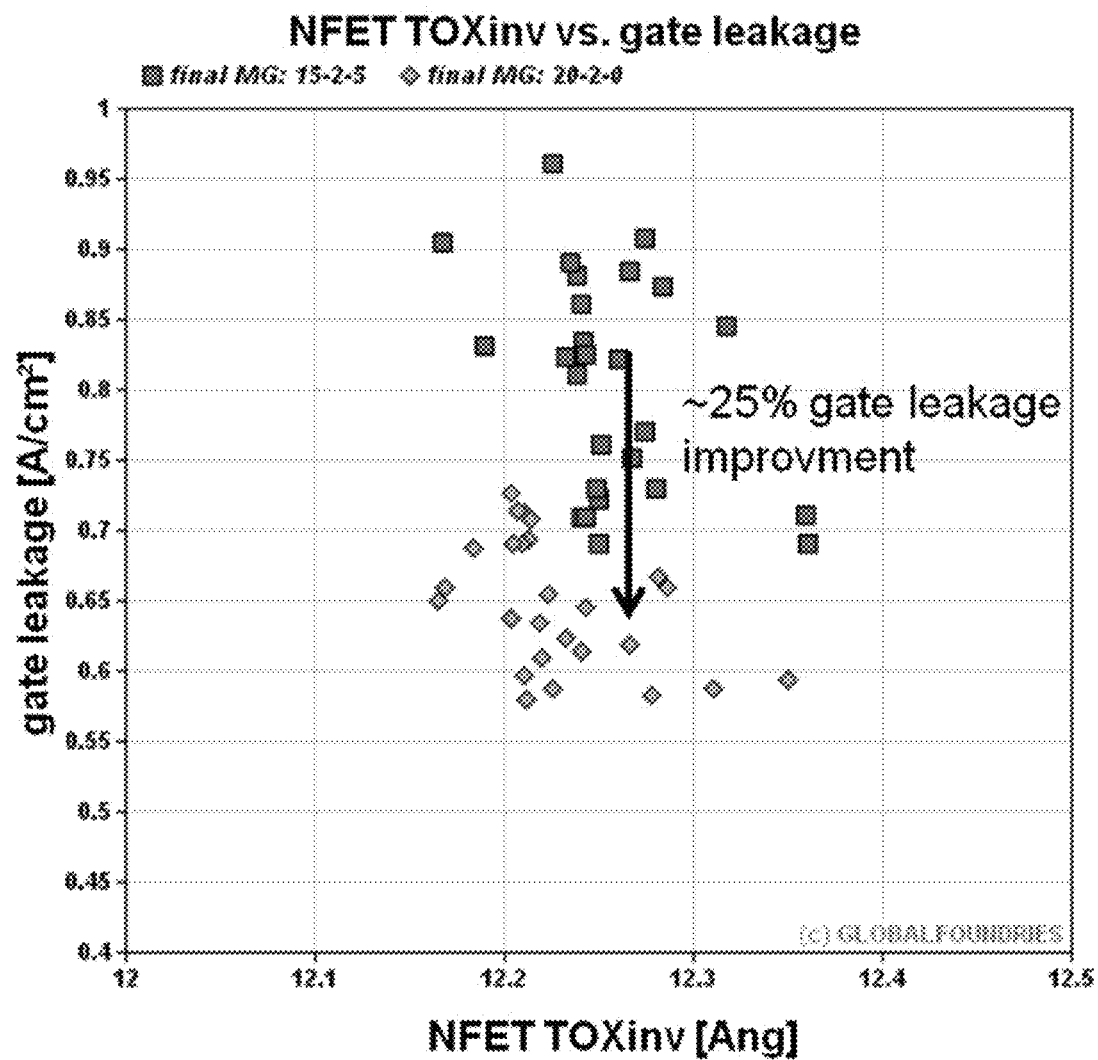
FIGS. 2A-2F depict comparative testing results for various embodiments of the prior art device shown in FIG. 1 and various embodiments of the novel transistor device shown in FIG. 2.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of an improved metal gate structure for semiconductor devices, such as transistors. As will be readily apparent to those skilled in the art upon a complete reading of the present application, the presently disclosed methods and devices may be applied to a variety of different technologies, e.g., NFET, PFET, CMOS, etc., and they may be readily employed with a variety of integrated circuit devices, including, but not limited to, logic devices, memory devices, etc. With reference to the attached figures, various illustrative embodiments of the devices disclosed herein will now be described in more detail.

FIG. 2 depicts one illustrative embodiment of a novel transistor 100 with a novel gate structure 122 that simulation testing has shown produces surprising and unexpected performance improvement as compared to the prior art transistor device 10 depicted in FIG. 1. As shown in FIG. 2, the novel transistor structure 100 is formed in and above a semiconducting substrate 111 in an active area defined by a shallow trench isolation structure 113. At the point of fabrication depicted in FIG. 2, the novel gate structure 122 of the device 100 includes a gate insulation layer 112 (with a thickness in the range of about 1-7 nm depending upon the type of transistor being manufactured), e.g., silicon dioxide, silicon oxynitride, etc., a layer of a high-k insulating material 114 (k value of 10 or greater), e.g., hafnium oxide, hafnium silicate (HfSiON), etc. (with a thickness in the range of about 1.5-3 nm), a layer of titanium nitride 116 (with a thickness in the range of about 1.5-3.5 nm), a layer of aluminum 118 (with a thickness in the range of about 0.1-0.5 nm) and a layer of polysilicon 121 (with a thickness in the range of about 50-65 nm). Also depicted in FIG. 2 is an illustrative protective gate cap layer 123 (e.g., silicon nitride), illustrative sidewall spacers 124 (e.g., silicon nitride), a layer of insulating material 126 (e.g., silicon dioxide) and source/drain regions 115 formed in the substrate 111. In one particularly illustrative example, the novel gate structure 122 of the device 100 includes a silicon dioxide gate insulation layer 112 having a thickness of about 1 nm, a layer of hafnium oxide 114 having a thickness of about 1.7 nm, a layer of titanium nitride 116 having a thickness of about 2.0 nm, a layer of aluminum 118 having a thickness of about 0.2 nm and a layer of polysilicon 121 having a thickness of about 56 nm.

The various components and structures of the device 100 may be formed using a variety of different materials and by performing a variety of known techniques. For example, the sidewall spacers 124 may be comprised of silicon nitride and the layer of insulating material 126 may be comprised of silicon dioxide. The source/drain regions 115 may be comprised of implanted dopant materials (N-type dopants for NFET devices and P-type dopant for PFET devices) that are implanted into the substrate using known masking and ion implantation techniques. Of course, those skilled in the art will recognize that there are other features of the transistor 100 that are not depicted in the drawings for purposes of clarity. For example, so-called halo implant regions are not depicted in the drawings, as well as various layers or regions of silicon/germanium that are typically found in high-performance PFET transistors.

The substrate 111 may have a variety of configurations, such as the depicted bulk silicon configuration. The substrate 111 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor structures. The substrate 111 may also be made of materials other than silicon.

The device 100 depicted in FIG. 2 may be formed using traditional gate-first manufacturing techniques. For example, in a CMOS product, after the N and P wells are formed in the substrate 111, the channel silicon/germanium layer (not shown) for the PFET devices may be formed, followed by the formation of the gate insulation layer 112. Then, the high-k insulation layer 114 is deposited above the gate insulation layer 112 for both the PFET and NFET devices. Next, work function adjusting metals may be deposited for the NFET and PFET devices (with appropriate masking layers in place), and a work function anneal process is performed to drive metal from the work function metals into the high-k insulation layer 114. However, as will be appreciated by those skilled in the art after a complete reading of the present application, in some applications, the work function adjusting metals may not be required. The work function adjusting metal material(s) may then be removed so as to thereby expose the high-k insulation layer 114 for both NFET and PFET devices. Then, the layer of titanium nitride 116 and the layer of aluminum 118 are deposited on both the NFET and PFET devices. Thereafter, the layer of polysilicon 121 and the gate cap layer 123 (e.g., silicon nitride) are blanket deposited above the layer of aluminum 118. The various layers of material may then be patterned into the final gate structure for the device 100 using known etching and photolithography techniques. The sidewall spacers 124 may be formed by depositing a layer of spacer material and thereafter performing an anisotropic etching process on the layer of spacer material.

FIGS. 2A-2F reflect data resulting from testing various embodiments of the prior art device 10 shown in FIG. 1 and various embodiments of the novel transistor device 100 shown in FIG. 2. In FIGS. 2A-2F, the square-shaped data points ("☐") are for the prior art device 10 having the metal layers 16 (TiN—1.5 nm thickness), aluminum 18 (0.2 nm thickness) and 20 (TiN—0.5 nm thickness) of the gate structure 22 depicted in FIG. 1, whereas the data points ("◊") are for the novel device 100 depicted in FIG. 2 with the metal layers 116 (TiN—2.0 nm in thickness) and the layer of aluminum 118 (0.2 nm in thickness).

Figure 2B:
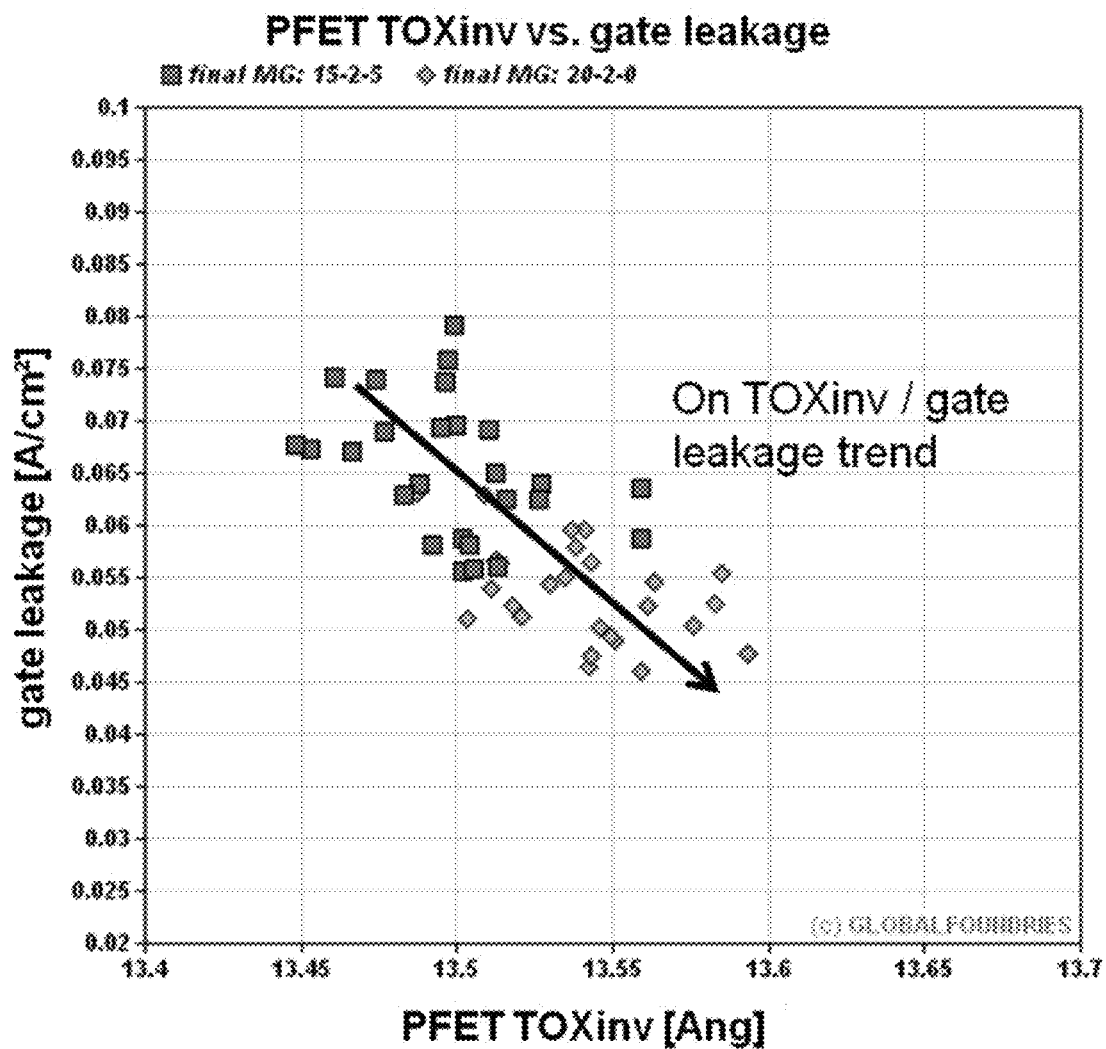

FIGS. 2A-2B are plots of data that compares simulation of the leakage current through the gate insulation layer ("gate oxide" or "GOX") for an illustrative NFET device (FIG. 2A) and an illustrative PFET device (FIG. 2B). In both of the FIGS. 2A-2B, the horizontal axis reflects the electrical thickness of gate dielectric ("TOXinv") of the completed transistor device in angstroms, while the vertical axis reflects the gate leakage in units of amps/cm$^2$. As can be seen in FIG. 2A, for an NFET device using the novel gate structure disclosed herein, there was about a 25% decrease in the gate leakage current—a highly desirable outcome—at the same TOXinv. Similarly, as shown in FIG. 2B, the gate leakage current for a PFET device using the novel gate structure disclosed herein also decreased, following the same TOXinv/gate leakage trend.

Figure 2C:
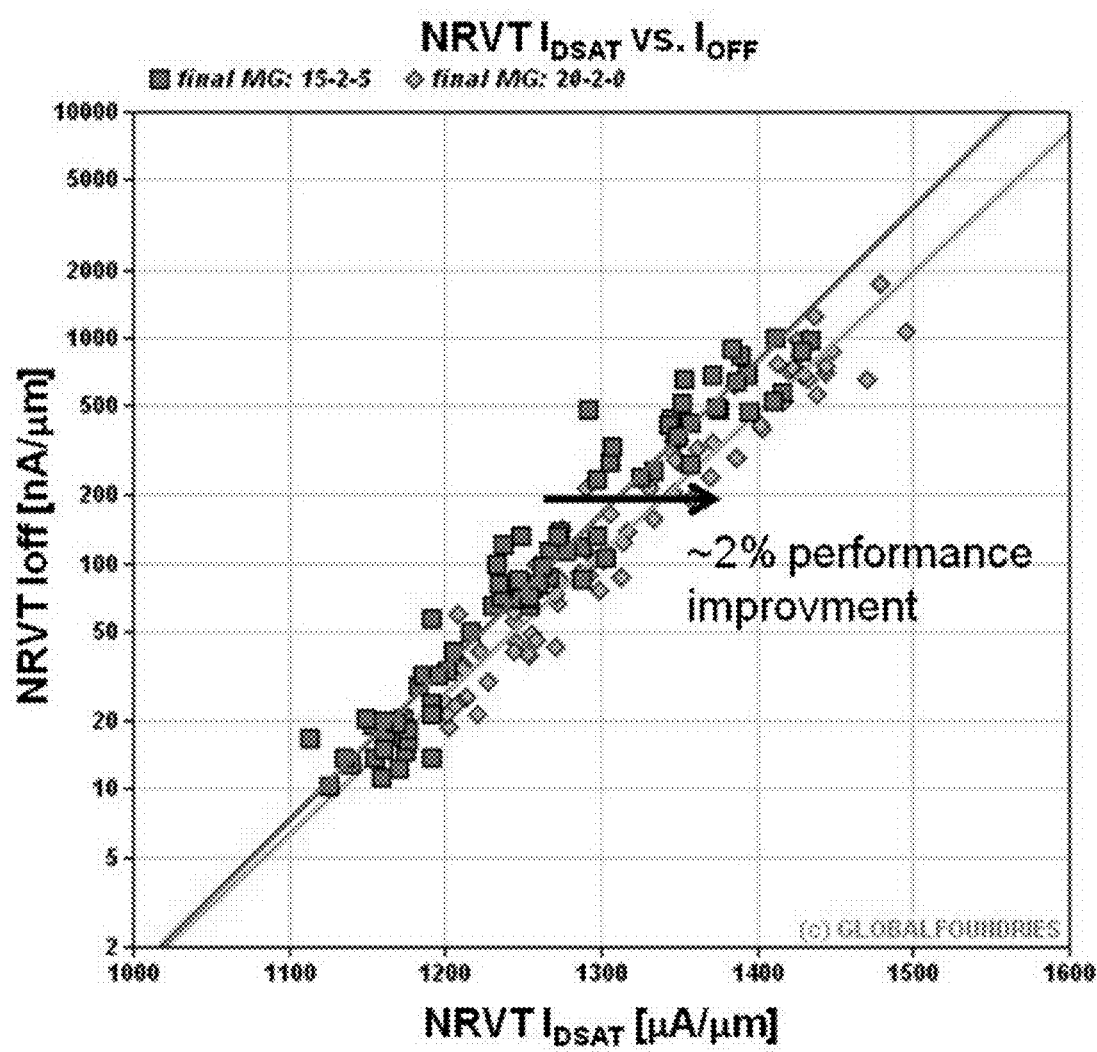
Figure 2D:
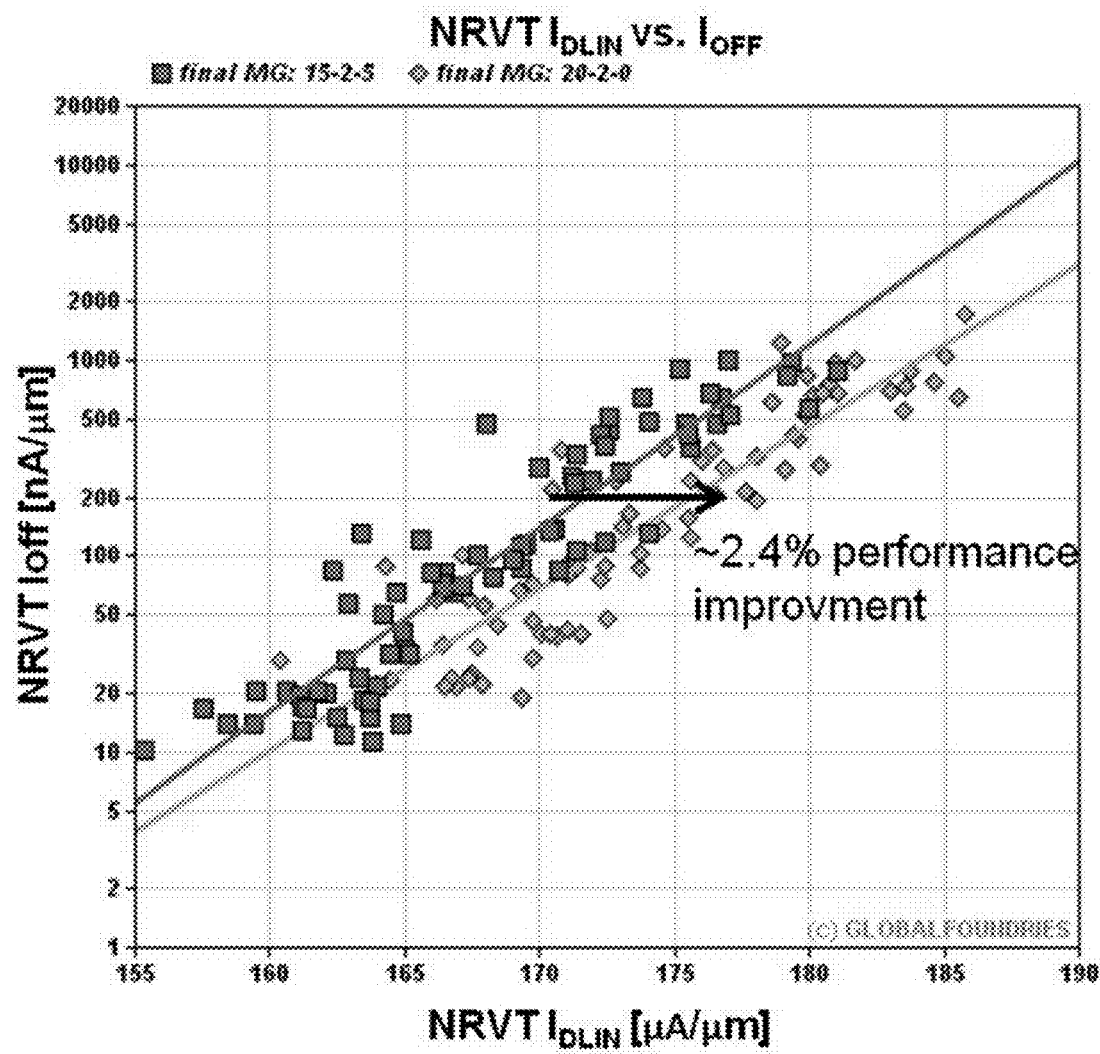

FIGS. 2C-2D are plots that reflect comparative data from testing of NFET devices made in accordance with the prior art device 10 shown in FIG. 1 and the novel device shown in FIG. 2, wherein both of the devices have a silicon dioxide gate insulation layer with a thickness of about 1 nm and a layer of hafnium oxide with a thickness of about 1.7 nm. FIG. 2C is a plot of the universal curve $I_{off}$ vs. $I_{on}$—a plot reflecting the drain performance of the device 100. FIG. 2D is a plot of the universal curve $I_{off}$ vs. $I_{on}$—a plot reflecting the linear performance of the device 100. The horizontal axis in FIG. 2C reflects the "on" current of the regular transistor in saturation normalized based upon the gate width in units of μA/μm. The horizontal axis in FIG. 2D reflects the "on" current of the regular transistor in the linear regions normalized based upon the gate width in units of μA/μm. The vertical axis in both FIGS. 2C and 2D reflect the "off" current of the regular transistor normalized based upon the gate width in units of nA/μm. As can be seen in FIG. 2C, a novel NFET device 100 depicted in FIG. 2 herein exhibited an improved performance in saturation of approximately 2% relative to the prior art NFET device 10 depicted in FIG. 1. Similarly, as shown in FIG. 2D, the novel NFET device 100 disclosed herein exhibited an improvement in the linear region of approximately 2.4% as compared to the prior art NFET device 10. These surprising and significant improvements in performance characteristics of the novel NFET device 100 disclosed herein can offer significant improvement in the operational characteristics of integrated circuit products incorporating such devices.

Figure 2E:
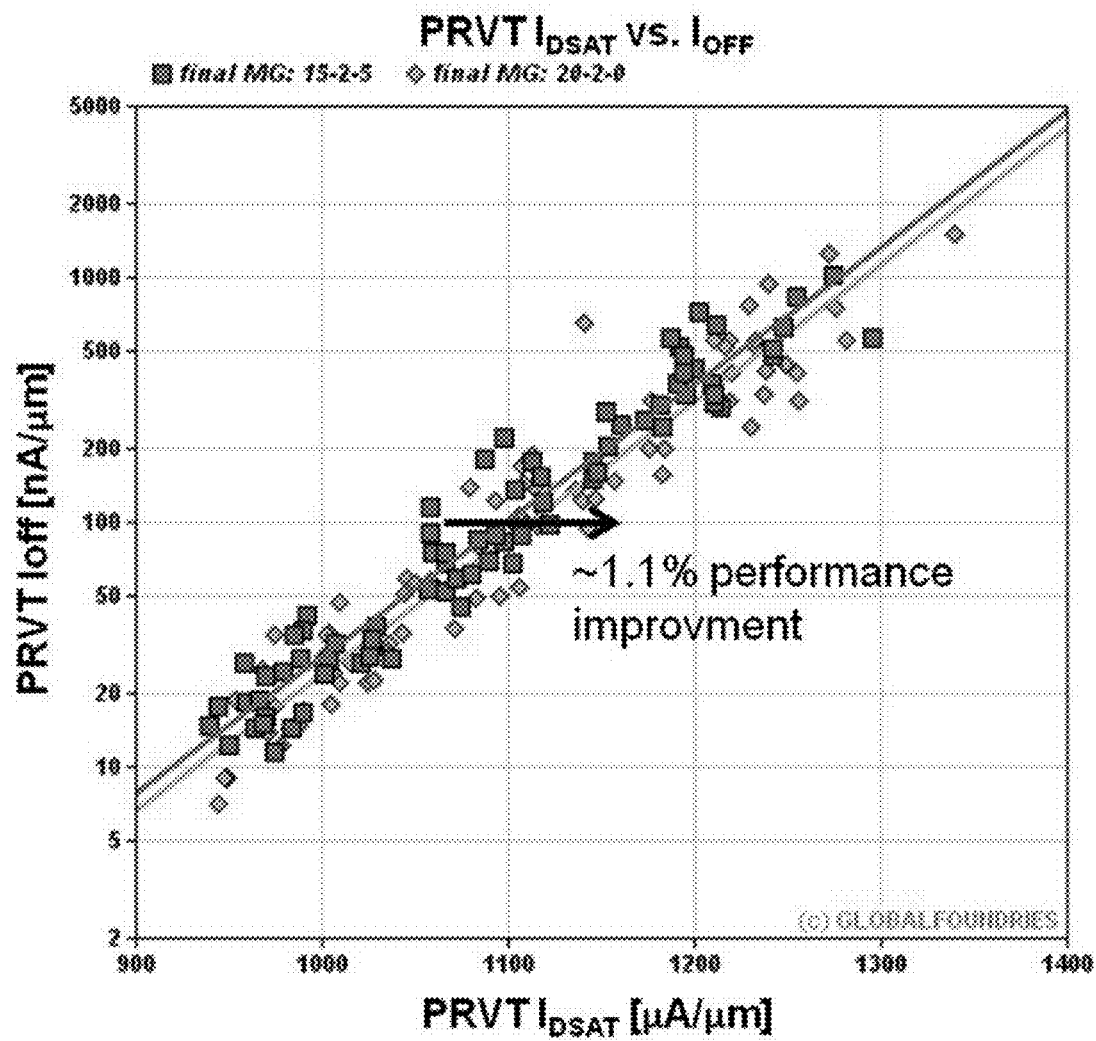
Figure 2F:
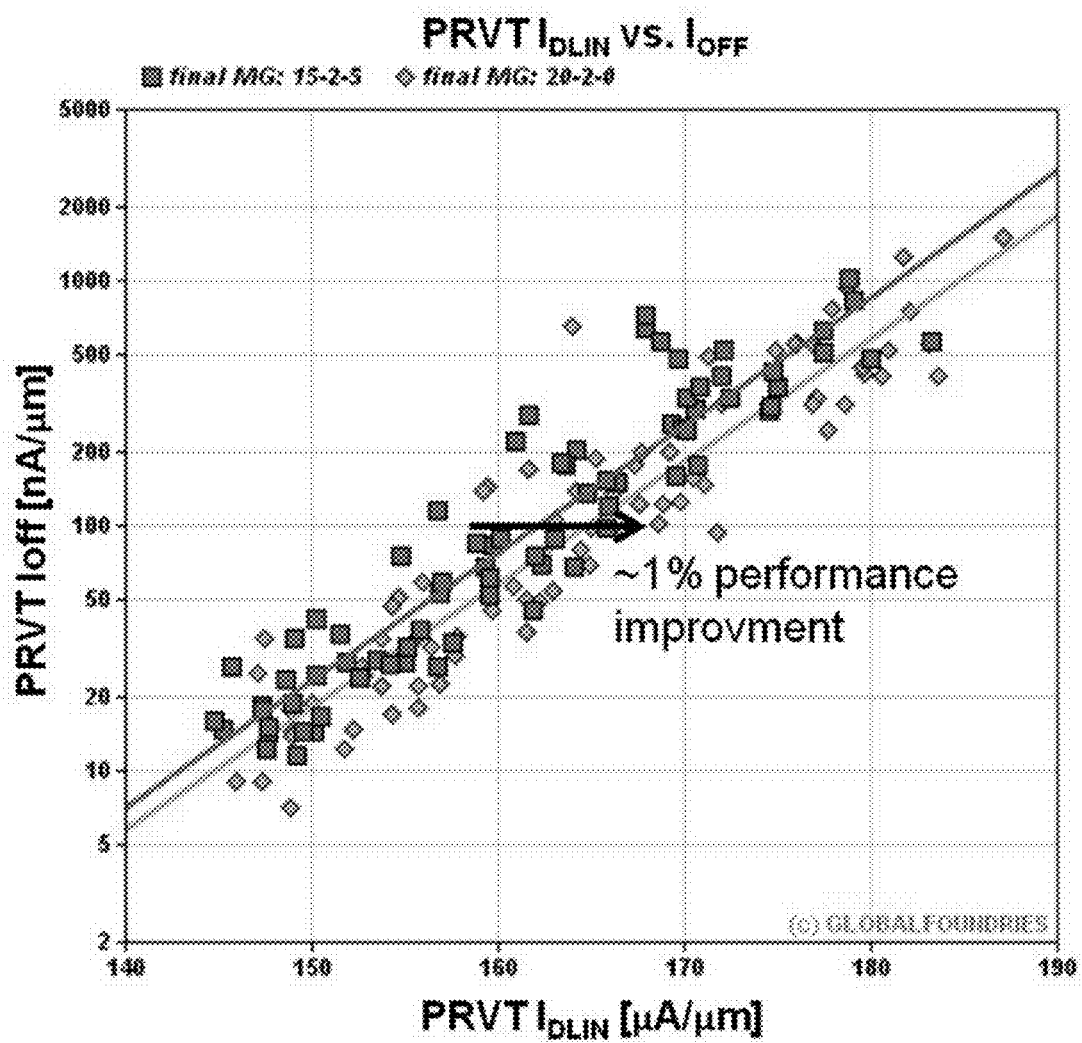

FIGS. 2E-2F are plots that reflect comparative data from testing of PFET devices made in accordance with the prior art device 10 shown in FIG. 1 and the novel device 100 shown in FIG. 2, wherein both of the devices have a silicon dioxide gate insulation layer with a thickness of about 1 nm and a layer of hafnium oxide with a thickness of about 1.7 nm.

FIG. 2E is a plot of the universal curve $I_{off}$ vs. $I_{on}$—a plot reflecting the drain performance of the device 100. FIG. 2F is a plot of the universal curve $I_{off}$ vs. $I_{on}$—a plot reflecting the linear performance of the device 100. The horizontal axis in FIG. 2E reflects the "on" current of the regular transistor in saturation normalized based upon the gate width in units of µA/µm. The horizontal axis in FIG. 2F reflects the "on" current of the regular transistor in the linear regions normalized based upon the gate width in units of µA/µm. The vertical axis in both FIGS. 2E and 2F reflect the "off" current of the regular transistor normalized based upon the gate width in units of nA/µm. As can be seen in FIG. 2E, the novel PFET device 100 depicted in FIG. 2 herein exhibited an improvement in performance in saturation of approximately 1.1% relative to the prior art PFET device 10 depicted in FIG. 1. Similarly, as shown in FIG. 2F, the novel device 100 disclosed herein exhibited an improvement in the linear region of approximately 1.2% as compared to the prior art PFET device 10. These surprising and significant improvements in performance characteristics of the novel PFET device 100 disclosed herein can offer significant improvement in the operational characteristics of integrated circuit products incorporating such devices.

A comparison of the above testing data shows that the performance of the novel NFET device 100 disclosed herein is increased by about 2-2.4%, whereas the performance of the novel PFET devices disclosed herein is improved by about 1.1-1.2%. The reason that there is a more pronounced improvement in the performance capability of the NFET device as compared to the PFET device is believed to be because there is less diffusion of performance-degrading aluminum into the high-k gate insulation material of the NFET device due to the use of the thicker layer of titanium nitride 116 (2.0 nm) as compared to the thinner layer of titanium nitride 16 (1.5 nm) used for the prior art device 10 shown in FIG. 1. In the novel device 100 disclosed herein, having the aluminum layer 118 contact the polysilicon material 121 provides an aluminum-rich interface between the metal gate materials and the polysilicon material 121. This configuration results in the formation of a higher quality layer of polysilicon with a lower number of defects.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor formed in and above a semiconducting substrate, said transistor having a gate structure consisting of:
   a silicon dioxide gate insulation layer positioned on said semiconducting substrate, said silicon dioxide gate insulation layer having a thickness of about 1 nm;
   a single layer of hafnium oxide or hafnium silicate positioned on said silicon dioxide gate insulation layer, said single layer of hafnium oxide or hafnium silicate having a thickness of about 1.7 nm;
   a layer of titanium nitride positioned on said layer of hafnium oxide or hafnium silicate, said layer of titanium nitride having a thickness of about 2 nm;
   a layer of aluminum positioned on said layer of titanium nitride; and
   a layer of polysilicon positioned on said layer of aluminum.

2. A transistor formed in and above a semiconducting substrate, said transistor having a gate structure consisting of:
   a silicon dioxide gate insulation layer positioned on said semiconducting substrate, said silicon dioxide gate insulation layer having a thickness of about 1 nm;
   a hafnium oxide layer positioned on said silicon dioxide gate insulation layer, said hafnium oxide layer having a thickness of about 1.7 nm;
   a layer of titanium nitride positioned on said hafnium oxide layer, said layer of titanium nitride having a thickness of about 2 nm;
   a layer of aluminum positioned on said layer of titanium nitride, said layer of aluminum having a thickness of about 0.2 nm; and
   a layer of polysilicon positioned on said layer of aluminum.

* * * * *

UNITED STATES PATENT AND TRADEMARK OFFICE
CERTIFICATE OF CORRECTION

| | | |
|---|---|---|
| PATENT NO. | : 8,872,285 B2 | Page 1 of 1 |
| APPLICATION NO. | : 13/781907 | |
| DATED | : October 28, 2014 | |
| INVENTOR(S) | : Scheiper et al. | |

It is certified that error appears in the above-identified patent and that said Letters Patent is hereby corrected as shown below:

In the claim

Claim 1, column 8, line 25, delete "on said layer of" and insert therefor -- on said single layer of --.

Signed and Sealed this
Seventeenth Day of March, 2015

Michelle K. Lee
*Director of the United States Patent and Trademark Office*